United States Patent [19]

Shino

[11] Patent Number: 4,825,283
[45] Date of Patent: Apr. 25, 1989

[54] IC CARD

[75] Inventor: Katsuhide Shino, Nara, Japan

[73] Assignee: Sharp Kabushiki Kaisha, Osaka, Japan

[21] Appl. No.: 65,288

[22] Filed: Jun. 22, 1987

[30] Foreign Application Priority Data

Jul. 3, 1986 [JP] Japan .............................. 61-102762[U]

[51] Int. Cl.⁴ ..................... H01L 23/02; H01L 23/12; H02G 13/08
[52] U.S. Cl. ......................................... 357/74; 357/72; 357/80; 174/52.1; 361/394; 361/399; 361/392
[58] Field of Search ............................. 357/74, 80, 72; 361/392-399, 395, 394; 174/52 R, 52 PE, 52 S, 52 FP

[56] References Cited

U.S. PATENT DOCUMENTS

| 4,007,479 | 2/1977 | Kowalski | 357/74 |
| 4,346,817 | 8/1982 | Karcher | 174/52 R |
| 4,727,246 | 2/1988 | Hara et al. | 174/52 FP |

*Primary Examiner*—William L. Sikes
*Assistant Examiner*—Georgia Y. Epps
*Attorney, Agent, or Firm*—Flehr, Hohbach, Test, Albritton & Herbert

[57] ABSTRACT

An IC card has supporting pieces which penetrate its module to firmly secure it such that the module is prevented from easily popping out of the card or cracking when an external force is applied on the card.

9 Claims, 3 Drawing Sheets

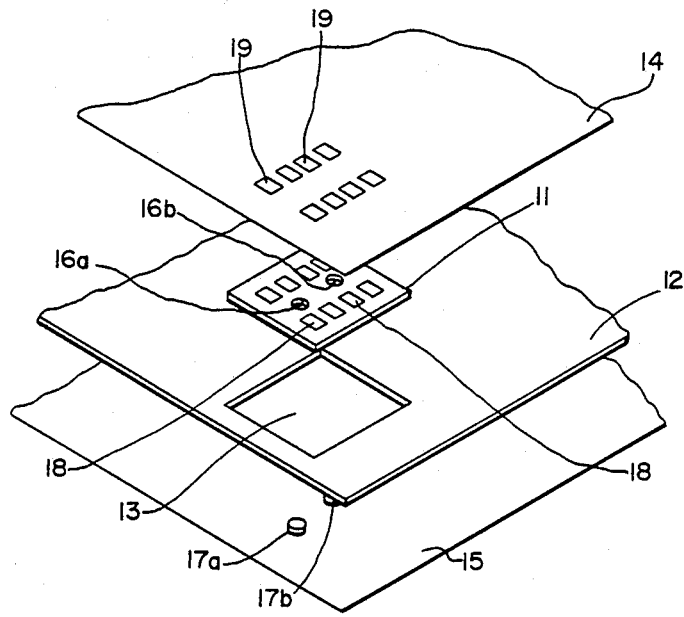
FIG.—1
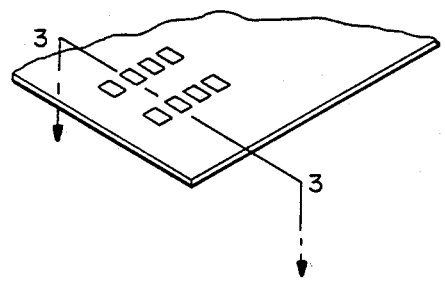
FIG.—2
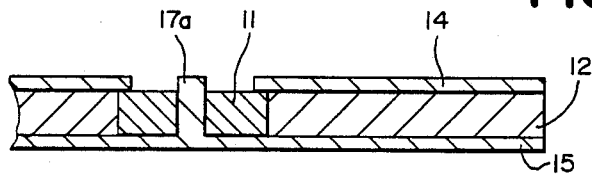
FIG.—3
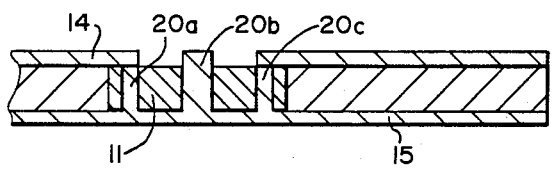
FIG.—4

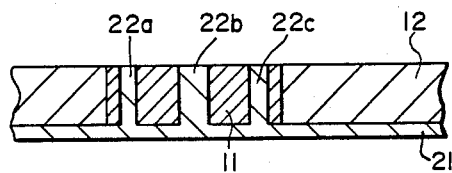
FIG.—5
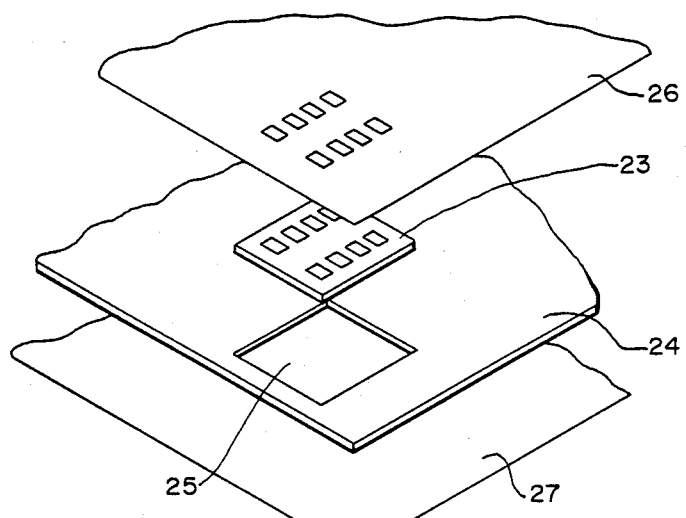
(PRIOR ART)
FIG.—6
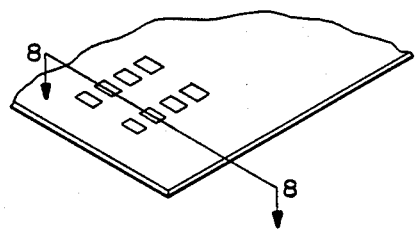
(PRIOR ART)
FIG.—7

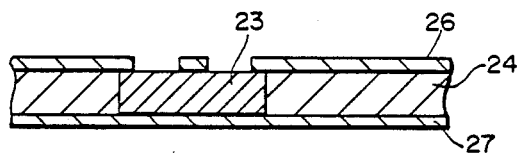
(PRIOR ART)
FIG.—8
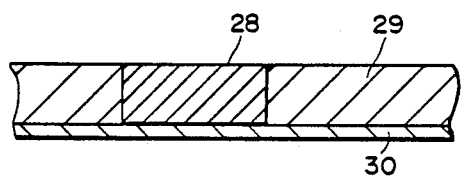
(PRIOR ART)
FIG.—9
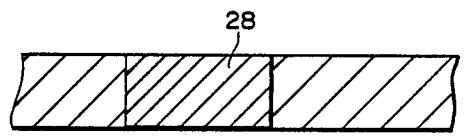
(PRIOR ART)
FIG.—10

IC CARD

BACKGROUND OF THE INVENTION

This invention relates to an IC card having supporting members which penetrate and secure a module contained therein.

In FIG. 6 which shows the structure of a conventional laminated IC card, a module 23 fits inside a hole 25 provided to a core member 24 and two resin sheets 26 and 27 are pasted sandwichingly thereonto from both sides. The portion of the card containing the module 23 therefore looks as shown in FIG. 7. As can be understood clearly from FIG. 8 which is a sectional view of an IC card of this type, the module is frequently subjected to bending forces from both end sections. If the card is repeatedly bent, therefore, cracks are likely to develop in the module.

Some IC cards are not of a laminated structure but are formed merely by insertion into a core member as shown in FIGS. 9 and 10 wherein numerals 28, 29 and 30 respectively indicate a module, the core member into which the module 28 is inserted and a resin sheet. IC cards of these types have the problem of the module popping out of the main body when the card is bent even slightly.

SUMMARY OF THE INVENTION

It is therefore an object of the present invention to provide an IC card with improved strength against bending.

The above and other objects of the present invention are achieved by providing an IC card having supporting members which penetrate its module to secure it.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings:

FIG. 1 is an exploded view of a section of an IC card embodying the present invention, FIG. 2 is a perspective view of a section of the IC card of FIG. 1, FIG. 3 is a sectional view of the IC card of FIG. 2 taken along the line 3—3 of FIG. 2, FIG. 4 is a sectional view of a section of another IC card embodying the present invention, FIG. 5 is a sectional view of a section of still another IC card embodying the present invention, FIG. 6 is an exploded view of a section of a conventional IC card, FIG. 7 is a perspective view of a section of the IC card of FIG. 6, FIG. 8 is a sectional view of a section of the IC card of FIG. 8 taken along the line 8—8 of FIG. 7, FIG. 9 is a sectional view of a section of another conventional IC card, and FIG. 10 is a sectional view of a section of still another conventional IC card.

Before the description of the present invention proceeds, it is to be noted that like parts are designated by like reference numerals throughout the accompanying drawings.

DETAILED DESCRIPTION OF THE INVENTION

The structure of an IC card embodying the present invention is schematically shown in FIG. 1 wherein numeral 11 indicates a module comprising an integrated circuit containing a central processing unit CPU and a memory device storing a control program. The module 11 fits engagingly into a hole 13 provided in a planar core member 12. With the module 11 thus supported by the core member 12, an upper resin sheet 14 and a lower resin sheet 15 are pasted to the core member 12 to sandwich the module 11 therebetween from both sides. The module 11 is provided with two holes 16a and 16b which completely penetrate it near its center. Corresponding to these holes 16a and 16b, supporting pieces 17a and 17b are formed on the lower resin sheet 15 so as to penetrate the holes 16a and 16b and to thereby secure the module 11 when the lower resin sheet is pasted on as explained above. The module 11 is further provided with connection terminals 18 on its surface and the upper resin sheet 14 are formed with holes 19 such that these terminals can be electrically connected to an external apparatus through the holes 19 after the upper resin sheet 14 is pasted on.

FIG. 2 is an external view of the IC card thus structured and FIG. 3 shows its sectional view where the module 11 is sandwiched between the resin sheets 14 and 15 and secured by supporting pieces 17a and 17b penetrating through it. Although only two supporting pieces 17a and 17b are shown in FIG. 1, the number of supporting pieces which penetrate the module to secure it is not intended to limit the scope of the invention. In the case of a multi-functional IC card provided with an input key section and a display section, for example, the module substrate may be relatively large in area. For such a card, three or more supporting pieces may be provided to penetrate the module such that the module will be secured at an increased number of positions as shown, for example, in FIG. 4 wherein the module 11 is penetrated by three supporting pieces 20a, 20b and 20c.

The foregoing description of a preferred embodiment of the invention has been presented for purposes of illustration and description. It is not intended to be exhaustive or to limit the invention to the precise form disclosed, and many modifications and variations are possible in light of the above teaching. For example, the scope of the present invention is not limited to laminated IC cards. FIG. 5 shows an IC card embodying the present invention of which the module 11 is not sandwiched between two sheets. The module 11 according to this embodiment is provided with three holes and is engagingly inserted into a core member 12, and a single resin sheet 21 is pasted onto the core member 12 from one side. The resin sheet 21 is provided with three supporting pieces 22a, 22b and 22c corresponding to the positions of the holes in the module 11 so as to pass therethrough, thereby serving to secure the module 11, as the resin sheet 21 is pasted onto the core member 12 as explained above. For a card thus structured with a resin sheet pasted only on one side of the core member into which the module is inserted, it is generally preferable to increase the number of supporting pieces which penetrate the module in order to compensate for the absence of the second resin sheet.

In summary, the present invention discloses IC cards provided with supporting pieces which penetrate the module such that the resistance of the module against external forces is enhanced. The module can thus be prevented from popping out of the card or cracking by the force applied onto the card when, for example, it is thrown into a pocket. Such modifications and variations that may be apparent to a person skilled in the art are intended to be included within the scope of this invention.

What is claimed is:

1. An IC card comprising
   an upper sheet,
   a lower sheet which is substantially parallel to said upper sheet,
   a module disposed between said upper and lower sheets, and
   at least one supporting piece secured to at least either one of said upper and lower sheets, said at least one supporting piece penetrating said module and improving strength of said card against bending.

2. The IC card of claim 1 wherein said module is formed with throughholes and said supporting pieces penetrate said module through said throughholes.

3. The IC card of claim 1 further comprising a planar core member, said module fitting engagingly in said core member.

4. The IC card of claim 3 wherein said lower sheet is pasted onto said core member from one side thereof.

5. The IC card of claim 4 wherein said supporting pieces are formed unistructurally with said lower sheet.

6. The IC card of claim 4 wherein said lower sheet is made of resin.

7. The IC card of claim 4 wherein said upper sheet is pasted onto said core member from the other side thereof.

8. The IC card of claim 7 wherein said upper sheet is made of resin.

9. The IC card of claim 7 wherein said upper sheet is formed with holes for allowing electrical contacts of said module to an external apparatus.

* * * * *